(12) United States Patent
Soininen

(10) Patent No.: US 7,971,861 B2
(45) Date of Patent: *Jul. 5, 2011

(54) SAFE LIQUID SOURCE CONTAINERS

(75) Inventor: Pekka T. Soininen, Helsinki (FI)

(73) Assignee: ASM International N.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/362,009

(22) Filed: Jan. 29, 2009

(65) Prior Publication Data

US 2009/0133632 A1    May 28, 2009

Related U.S. Application Data

(60) Division of application No. 11/647,518, filed on Dec. 28, 2006, now Pat. No. 7,497,420, which is a continuation of application No. 10/674,651, filed on Sep. 29, 2003, now Pat. No. 7,156,380.

(51) Int. Cl.
    *B01F 3/04*      (2006.01)
(52) U.S. Cl. ............... 261/122.1; 261/DIG. 65; 118/726
(58) Field of Classification Search ............... 261/121.1, 261/122.1, 124, DIG. 65; 118/726
See application file for complete search history.

(56) References Cited

U.S. PATENT DOCUMENTS

| | | | |
|---|---|---|---|
| 87,192 A | 2/1869 | Paine | |
| 113,147 A | 3/1871 | Dupas et al. | |
| 160,410 A | 3/1875 | Ferguson | |
| 230,656 A | 8/1880 | Radkey | |
| 1,103,789 A | 7/1914 | Macey | |
| 1,525,786 A | 2/1925 | Waldo | |
| 1,860,111 A | 5/1932 | Miller | |
| 2,206,688 A | 7/1940 | Bloomheart | |
| 2,333,898 A | 11/1943 | Stevenson et al. | |
| 2,485,739 A * | 10/1949 | Johnstone | 261/122.1 |
| 2,787,454 A * | 4/1957 | Coppola | 261/122.1 |
| 2,863,653 A * | 12/1958 | Cummings | 261/36.1 |
| 3,912,795 A | 10/1975 | Jackson | |

(Continued)

FOREIGN PATENT DOCUMENTS

DE      33 39 625 C2      1/1991

(Continued)

OTHER PUBLICATIONS

Leskelä et al., "ALS precursor chemistry: Evolution and future challenges," *Journal de Physique* IV France 9, 837-852, (1999).

(Continued)

*Primary Examiner* — Scott Bushey
(74) *Attorney, Agent, or Firm* — Knobbe Martens Olson & Bear LLP

(57) ABSTRACT

Containers for providing vapor phase reactant from liquid sources include bubbler designs and designs in which carrier gas flows over the liquid surface. Among the bubbler arrangements, a bypass conductance is provided to release excess pressure from the gas volume inside the container, or an enlarged bubbler tube is provided with a volume sufficient to accommodate all possible liquid backflow without having the liquid exit the container. Among the overflow designs, flow dividers provide a tortuous path for the gas to increase the time exposure of carrier gas packets to the evaporating liquid surface. The flow dividers can be microporous to encourage capillary action, thereby increasing the evaporating surface. The tortuous gas flow path can be separated from the liquid phase by a breathable semi-porous membrane that permits vapor phase reactant to pass through but prohibits liquid from passing in the other direction.

21 Claims, 12 Drawing Sheets

U.S. PATENT DOCUMENTS

| | | | |
|---|---|---|---|
| 3,957,466 A * | 5/1976 | Coppola | 96/354 |
| 3,957,467 A | 5/1976 | Kim | |
| 3,989,477 A | 11/1976 | Wilson et al. | |
| 4,268,279 A | 5/1981 | Shindo et al. | |
| 4,290,886 A * | 9/1981 | Takakuwa | 210/219 |
| 4,389,973 A | 6/1983 | Suntola et al. | |
| 4,393,013 A | 7/1983 | McMenamin | |
| 4,436,674 A | 3/1984 | McMenamin | |
| 4,548,138 A | 10/1985 | Korenberg | |
| 4,774,032 A | 9/1988 | Coates et al. | |
| 4,783,343 A | 11/1988 | Sato | |
| 4,883,362 A | 11/1989 | Gärtner et al. | |
| 4,904,419 A | 2/1990 | Reynolds | |
| 4,911,101 A | 3/1990 | Ballingall et al. | |
| 4,947,790 A | 8/1990 | Gärtner et al. | |
| 5,053,132 A | 10/1991 | Sirkar | |
| 5,078,759 A * | 1/1992 | Kira | 95/223 |
| 5,143,526 A | 9/1992 | Lee et al. | |
| 5,199,603 A | 4/1993 | Prescott | |
| 5,261,933 A * | 11/1993 | Greene | 95/150 |
| 5,385,689 A | 1/1995 | Tom et al. | |
| 5,543,043 A | 8/1996 | Bates et al. | |
| 5,551,278 A | 9/1996 | Rounbehler et al. | |
| 5,582,647 A * | 12/1996 | Kato et al. | 118/115 |
| 5,674,574 A | 10/1997 | Atwell et al. | |
| 5,698,037 A | 12/1997 | Stauffer | |
| 5,711,816 A | 1/1998 | Kirlin et al. | |
| 5,849,089 A * | 12/1998 | Tsunashima et al. | 118/726 |
| 5,904,771 A | 5/1999 | Tasaki et al. | |
| 6,033,493 A | 3/2000 | Hertz et al. | |
| 6,132,492 A | 10/2000 | Hultquist et al. | |
| 6,220,091 B1 | 4/2001 | Chen et al. | |
| 6,231,641 B1 | 5/2001 | Utigard et al. | |
| 6,270,839 B1 | 8/2001 | Onoe et al. | |
| 6,325,017 B1 | 12/2001 | DeBoer et al. | |
| 6,582,496 B1 | 6/2003 | Cheng et al. | |
| 6,905,541 B2 | 6/2005 | Chen et al. | |
| 7,018,478 B2 | 3/2006 | Lindfors et al. | |
| 7,156,380 B2 * | 1/2007 | Soininen | 261/122.1 |
| 7,186,385 B2 | 3/2007 | Ganguli et al. | |
| 7,270,709 B2 | 9/2007 | Chen et al. | |
| 7,497,420 B2 * | 3/2009 | Soininen | 261/104 |
| 2001/0042523 A1 | 11/2001 | Kesala | |
| 2003/0053799 A1 | 3/2003 | Lei | |
| 2004/0016404 A1 | 1/2004 | Gregg et al. | |
| 2005/0072357 A1 | 4/2005 | Shero et al. | |
| 2008/0173240 A1 | 7/2008 | Furukawahara et al. | |

FOREIGN PATENT DOCUMENTS

| | | |
|---|---|---|
| GB | 2 151 662 A | 7/1985 |
| JP | 011 168092 | 6/1999 |
| JP | 2006 6045637 | 2/2006 |
| WO | WO 2004/011695 | 2/2004 |

OTHER PUBLICATIONS

Smith, J.M., *Chemical Engineering Kinetics*, 3$^{rd}$ Edition, McGraw-Hill Book Company, p. 268-291 (1981).

Smith, J.M., *Chemical Engineering Kinetics*, 3$^{rd}$ Edition, McGraw-Hill Book Company, p. 554-563 (1981).

Suntola, "Atomic Layer Epitaxy," *Thin Solid Films*, 216: 84-89 (1992).

\* cited by examiner

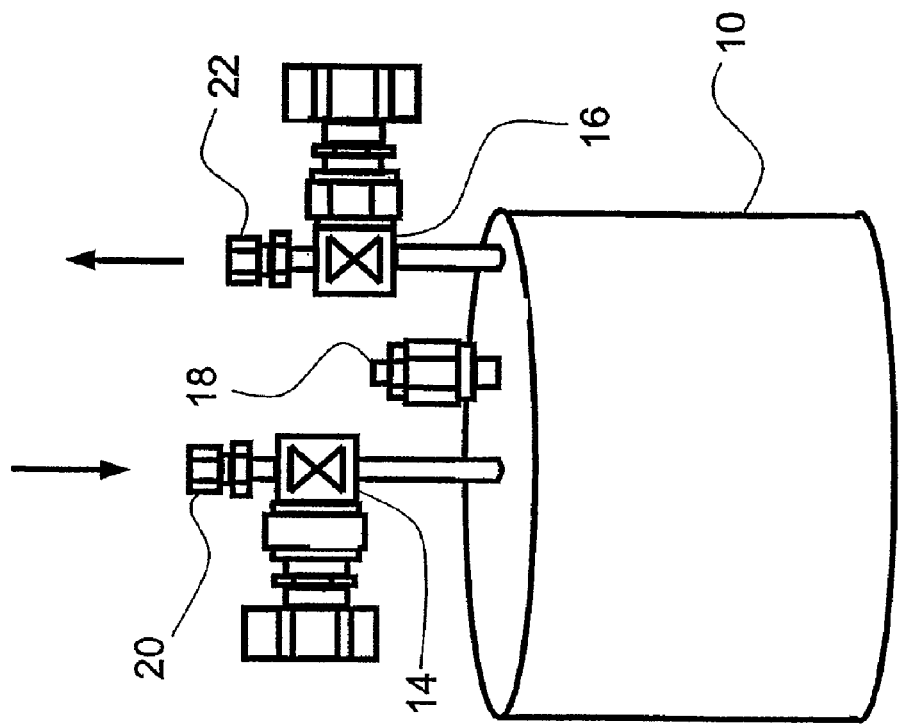
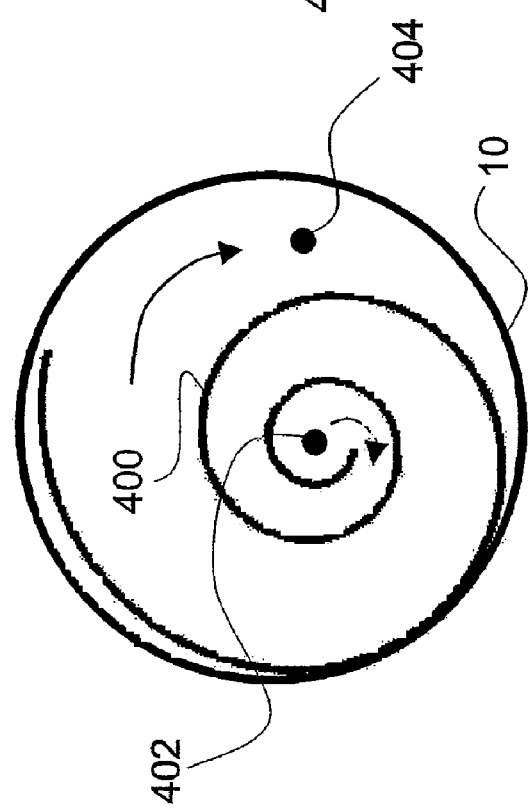
Fig. 4b
Fig. 4a

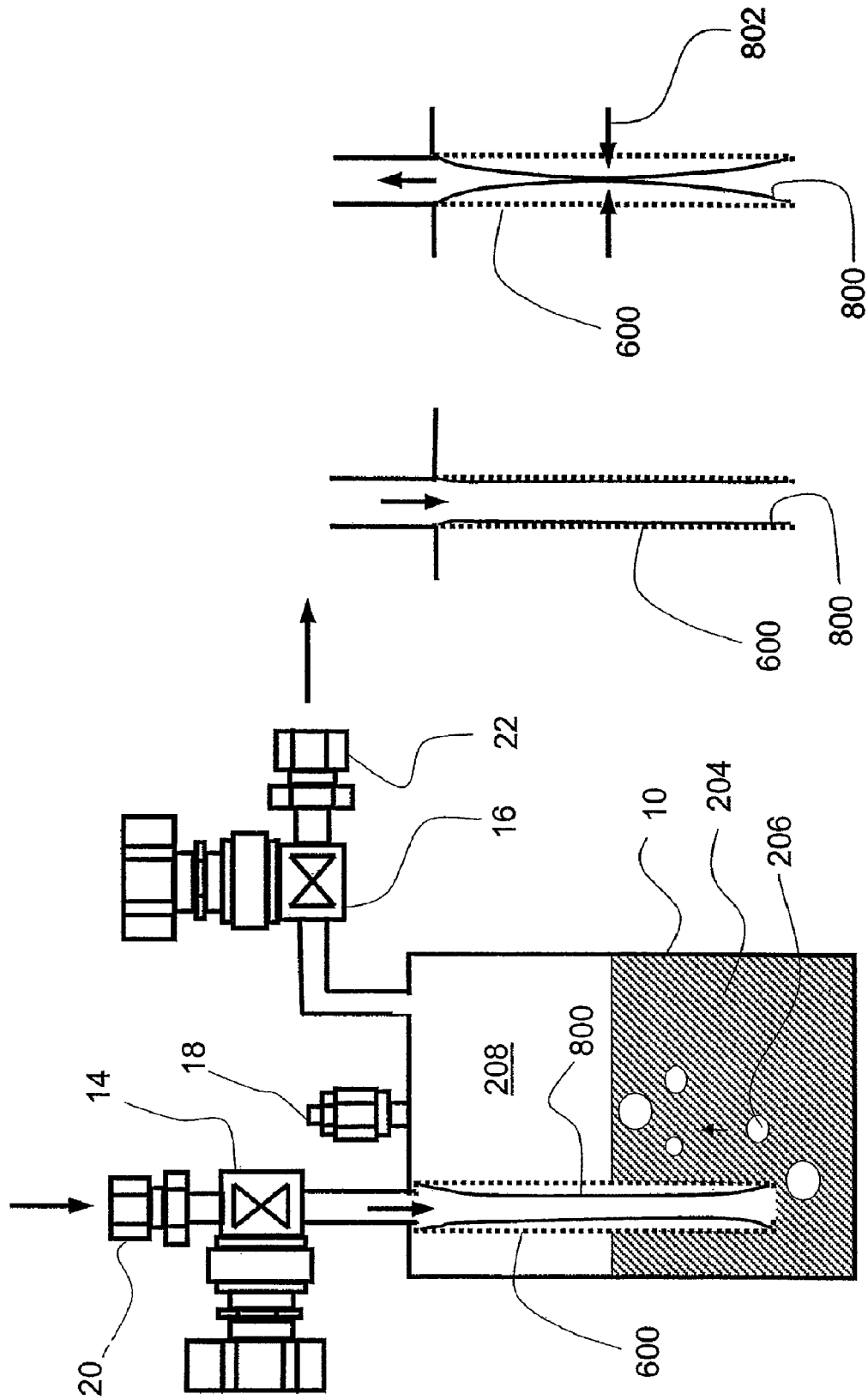

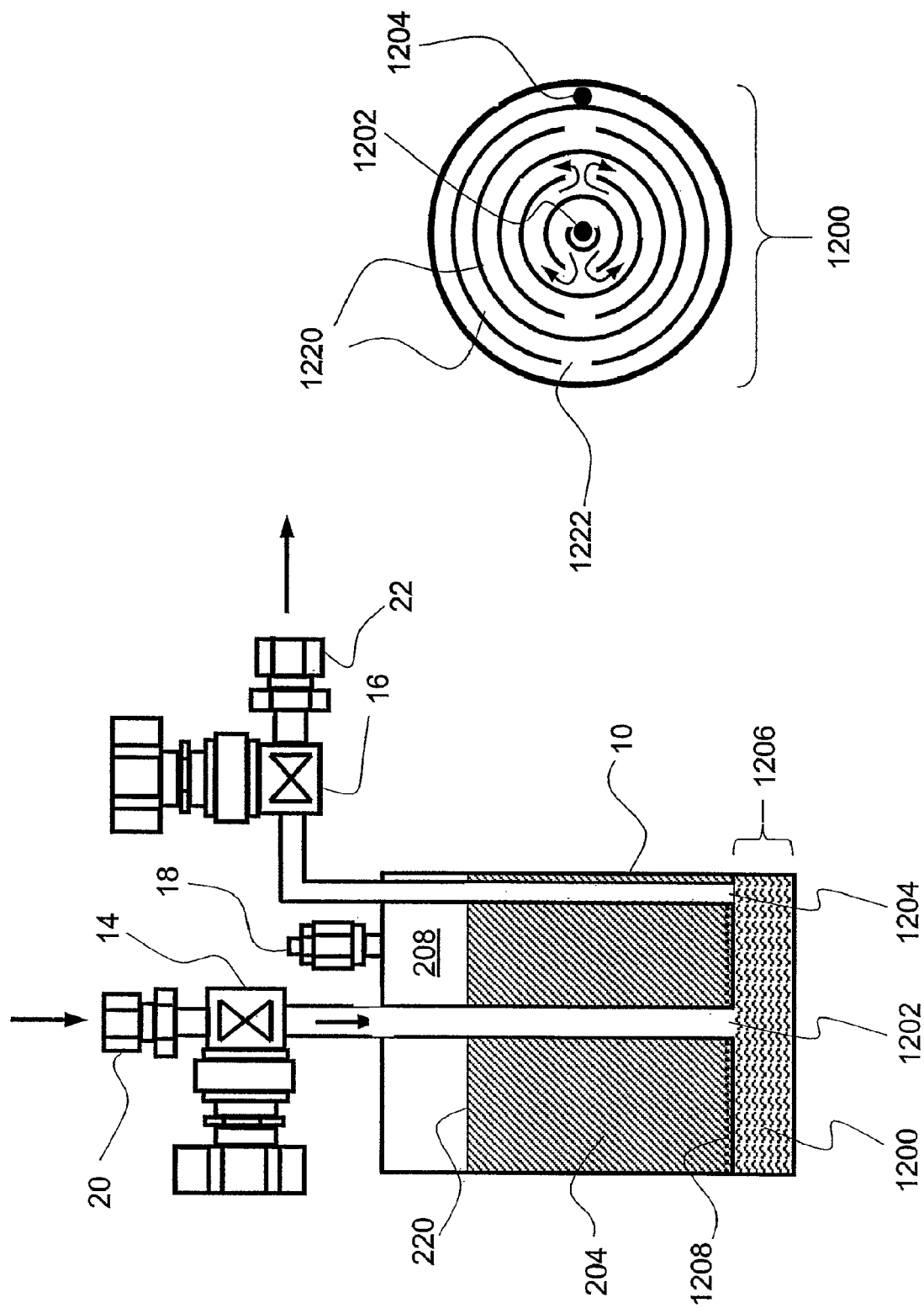

SAFE LIQUID SOURCE CONTAINERS

CROSS-REFERENCE TO RELATED APPLICATIONS

The present application is a divisional of U.S. patent application Ser. No. 11/647,518, filed Dec. 28, 2006, issued as U.S. Pat. No. 7,497,420 on Mar. 3, 2009, which is a continuation of U.S. patent application Ser. No. 10/674,651, filed Sep. 29, 2003, issued as U.S. Pat. No. 7,156,380 on Jan. 2, 2007, each of which is incorporated herein by reference in its entirety.

FIELD OF THE INVENTION

The present invention relates generally to vapor source containers and more particularly, to liquid source containers used for generating vapor precursor to be used in downstream chemical reactions.

BACKGROUND OF THE INVENTION

Bubbler-type liquid sources are often used in chemical reactors, such as semiconductor processing tools. Examples include chemical vapor deposition (CVD) and atomic layer deposition (ALD) reactors. Bubblers tend to exhibit better efficiency than so-called "overflow" sources, in which vaporization depends on heating and the carrier gas simply flows over the surface of liquid, rather than being bubbled through the liquid. The efficiency of the overflow sources depends greatly on flow conditions. On the other hand, bubbler type sources are not always safe. Under certain conditions there is risk that the pressure inside the source bottle is higher than in the inlet feeding tube (which is submerged in the liquid source). The higher pressure pushes the liquid precursor material into the carrier gas inlet of the feeding tube. This uncontrolled situation is a safety and contamination risk. This type of risk is higher with ALD reactors due to the fact that the operation is based on pulsing and there is typically more than one route for the gases into the reactor. These conditions increase the risk of accidentally pumping the gas inlet tubing to a lower pressure than the liquid container.

A source container 10 shown in FIG. 1 is positioned in a temperature-controlled environment 12. The container 10 has a bottle inlet 20 for the inactive carrier gas and a bottle outlet 22 for the gas mixture generated in the source container 10. A manual inlet isolation valve 14 and an outlet isolation valve 16 are used for isolating the container 10 from the surrounding conduits and room atmosphere when a depleted container is replaced with a refilled one. The source container has a refill port 18 that is used for adding liquid source chemical to the container, and in some arrangements the port is provided in fluid communication with an auto-refiller to maintain a minimum level of liquid source. A computer-controlled three-way valve 24 directs inactive gas either to the container 10 or to a by-pass line 90.

A computer-controlled source valve 26 is used for regulating the flow of gas mixture from the container 10 to the reaction space 52. A computer-controlled by-pass valve 28 is used for purging the inlet 20 and outlet 22 of the residual source chemical vapor before replacing a depleted container 10 with a fresh one. The by-pass valve 28 is kept closed during deposition processes. The computer controlled valves 24, 26, 28 are placed in a temperature-controlled environment 30 to prevent the condensation of the source chemical vapor at these valves.

A reaction chamber 50 defines a reaction space 52 in which a substrate 54 is housed. The reaction space 52 is in fluid communication with chemical sources, including the liquid source container 10, through a source conduit 92, and in fluid communication with a vacuum pump 70 through an exhaust conduit 72. The vacuum pump has an outlet 74 for gases. A back-suction conduit 96 is in fluid communication with the exhaust conduit 72 and in fluid communication with the source conduit 92 at a junction 98 that is placed between the reactor 56 and the computer-controlled source valve 26. A back-suction restrictor 104, e.g. a capillary, restricts the flow rate of gases through the back-suction conduit 96 to the exhaust conduit 72.

A by-pass restrictor 100, e.g. a capillary, restricts the flow rate of inactive gas from the three-way valve 24 through the by-pass conduit 90 that is connected to the source conduit 92 at a connection point 94. The connection point 94 is placed in the source conduit 92 between the reaction chamber 50 and the junction 98 of the back-suction conduit 96. Flow rate restrictors 106, 108, e.g. capillaries, are placed in the source conduit 92 on both sides of the by-pass conduit connection point 94 to form a gas diffusion barrier volume between the said flow rate restrictors 106, 108. The flow rate restrictors 100, 104, 106, 108 are shown inside temperature-controlled environments 30, 56 to enable fast purging of the conduits 90, 92.

At least two source chemicals (one shown in FIG. 1) are connected to the reaction chamber 50 and are alternately pulsed into the reaction space 52 during an ALD process. The source chemical pulses are preferably separated with inactive gas flow that purges the reaction space, although other means are known for keeping the reactant gases separate spatially and temporally. A typical ALD pulsing sequence consists of four basic process steps: reactant A pulse, purge A, reactant B pulse, purge B. The pulsing sequence is repeated as many times as is needed for obtaining a thin film of desired thickness. In other arrangements, the pulsing sequence can be more complicated.

Referring to FIG. 1, during a reactant A pulse, an inactive gas (e.g., nitrogen or argon) flows from an inactive gas source 40 through a mass flow controller 42. The three-way valve 24 guides the inactive gas to the source container 10. Evaporated source chemical vapor diffuses with the inactive gas inside the source container 10 and flows as a gas mixture to the outlet 22. The source valve 26 allows the gas mixture to flow to the reaction space 52 where the source chemical molecules chemisorb on the substrate 54 surface until available reactive surface sites have been filled with the molecules and the chemisorption process saturates, leaving no more than one molecular layer of the source chemical molecules or their chemisorbed fractions on the surface.

During a purge A step, the source valve 26 is kept closed and the three-way valve 24 guides the flow of the inactive gas through the by-pass conduit 90 to the gas diffusion barrier volume that is located in the vicinity of the connection point 94. The inactive gas flow divides into two parts with the help of the flow rate restrictors 106, 108. About 90% of the inactive gas flows to the reaction space 52 and purges the residual reactant A away from the reaction space 52 to the exhaust conduit 72. About 10% of the inactive gas flows backwardly through the source conduit 92 to the junction point 98 of the back-suction conduit 96 and then the gas flows through the back-suction conduit 96 to the exhaust conduit 72 and finally to the vacuum pump 70. The backward flow makes sure that source chemical molecules do not diffuse along the source conduit 92 to the reaction space 52 during the purge period.

It will be understood that certain problems related to the liquid source are created with the source pulsing method. If the source container 10 is a bubbler and the three-way valve malfunctions, it is possible that the gas pressure at the inlet 20 to the container 10 becomes smaller than the gas pressure inside the container 10. In that case the bubbler pressure tends to push some liquid toward the gas inlet 20 and even further upstream of the container 10. The by-pass conduit 90 can become thereby contaminated with the source chemical and the reactor does not operate in ALD mode any longer.

As shown in FIG. 2a, a bubbler tube 200 extends into the source container 10 so that the tip 202 of the bubbler tube is near the bottom of the source container 10. The tip 202 is thus below the surface 220 of the liquid source chemical. During a source chemical pulse, inactive gas is fed to the inlet 20, flows through the manual inlet isolation valve 14, through the bubbler tube 200 and forms bubbles 206 that rise to the surface of the liquid 220. Source chemical molecules diffuse into the inactive gas, forming a gas mixture, and the gas becomes more or less saturated with the source chemical vapor. The gas mixture leaves the gas space 208 of the container 10 through the manual outlet isolation valve 16 and continues through the outlet 22 and further to the reaction space (not shown).

Referring to FIG. 2b, in case of a malfunction, the pressure of the inactive gas at the inlet 20 may become smaller than the pressure of the gas mixture in the gas space 208 of the container 10. The pressure pushes the liquid surface 220 and forces liquid back through the bubbler tube 200 so that the liquid surface 222 in the bubbler tube 200 creeps towards the inlet 20 and upstream areas of the source conduits. This is problematic, especially in liquid sources that undergo rapid pressure variations during ALD processing. A backlash valve (not shown) placed at the inlet of the container is not entirely fail-safe because of corrosive source chemicals.

This problem has partially been alleviated with the use of an "overflow" source, shown in FIGS. 3a and 3b, rather than a bubbler, but it creates certain new problems. Inactive gas flows through the inlet 20 into the container 10. An inlet conduit is arranged to have its tip 300 always above the liquid surface 220 so that back-flow of the liquid upstream of the source is not possible. The inactive gas mixes with the source chemical vapor and the mixture enters a flow space 302 (arranged coaxially with the inlet in the illustrated example) and then the mixture flows through the manual outlet isolation valve 16 through the outlet 22 and further to the reaction space (not shown).

When the liquid is gradually consumed, the surface 220 of the liquid lowers and the distance between the tip 300 of the inlet conduit and the liquid surface 220 increases. When the distance becomes large, as shown in FIG. 3b, it takes a longer time for the source chemical molecules to mix with the inactive gas and the gas mixture becomes more dilute as deposition proceeds. It can be understood that the decreasing source chemical concentration creates problems with the dosage of the source chemical into the reaction space. Since the dosage per timed pulse decreases over time, either an overlong pulsing period is employed, which would waste time and reactant during initial phases, or the pulsing period must be increased over time, which is impractical for manufacturers to implement in process recipes that should be consistent from run to run. Rather than risking underdosage, the tendency is to overdose. ALD processes are not particularly sensitive to the dosage, since the surface reactions are self-saturating such that deposited layers remain uniform despite overdosage. Nevertheless it may be difficult to control the amount of overdosage of the source chemical and rather a lot of chemical is wasted.

Thus, there is a need for an improved liquid source that addresses at least some of the problems described above.

SUMMARY OF THE INVENTION

In accordance with one aspect of the invention, a liquid source chemical vaporizer is provided with a container configured to hold liquid source chemical up to a liquid fill level, and to additionally define an inner gas volume. A carrier gas inlet communicates carrier gas into the container. A gas outlet communicates with the inner gas volume of the container. A porous element is positioned to be in contact with the liquid source chemical and in contact with the inner gas volume within the container.

In one embodiment, the porous element is a flow divider extending the height of the container, defining a lengthened gas flow path in contact with a surface of the liquid, and also increasing the evaporating surface by encouraging capillary migration of the liquid up the microporous wall. In another embodiment, the porous element is a semi-porous membrane allowing vapor phase reactant to pass through, but not liquid. In another embodiment, the porous element is a bubbler tube, wherein the pores provide a by-pass conductance for excess pressure in the container to equalize pressure between the inlet and the inner gas volume without forcing liquid back up the bubbler tube. In one arrangement, an elastic liner within the bubbler tube collapses upon build-up of excess pressure within the container, preventing liquid flow up the bubbler tube. In another arrangement, a restrictive capillary provides an alternative or additional by-pass conductance.

In accordance with another aspect of the invention, a liquid source chemical vaporizer is provided for vaporizing liquid source chemical and delivering vapor phase chemical. The vaporizer includes another container that is configured to hold liquid source chemical. A carrier gas inlet communicates with an inner gas volume defined within the outer container. A gas mixture outlet communicates with the inner gas volume. At least one flow divider defines a gas flow path through the inner gas volume.

In one embodiment, the flow divider has microporous walls for increasing the evaporation rate of the source chemical while avoiding the backward flow of the liquid source chemical. In another embodiment, the at least one flow divider includes a semi-permeable gas-liquid interface that keeps the flow conduit dry. The semi-permeable membrane can be a simple tube, or a part of a wall separating the liquid from an inner compartment having further flow dividers defining a labyrinth gas flow path in communication with membrane.

In another aspect of the invention, a bubbler system is provided. The system includes a container, a bubbler tube extending into liquid source chemical within the container, and a gas mixture outlet communicating with a gas volume above the liquid chemical. A by-pass conductance path is provided for releasing excess pressure within the container relative to the gas inlet.

In one embodiment, the by-pass conductance is provided by openings in a bubbler tube providing conductance from an inner gas volume within the container to the inlet, thereby by-passing the liquid phase. In another embodiment, the by-pass conductance is provided by a capillary tube in communication with the inner gas volume and the inlet. In still another embodiment, an enlarged bubbler tube accommodates any possible backwards liquid flow, sized such that the liquid level drops below the bubbler tube opening before liquid rising up the bubbler tube can reach the gas inlet. Thereafter, gas can flow directly through the bubbler opening to the inlet, relieving any additional excess pressure.

BRIEF DESCRIPTION OF THE DRAWINGS

Further aspects, features and advantages of the present invention will become apparent from the following description of the preferred embodiments and from the appended drawings, which are meant to illustrate and not to limit the invention, and in which:

FIGS. 4a-12 are non-limiting illustrations (not to scale) of various preferred embodiments.

FIG. 4a is a schematic, cross-sectional plan view of a source chemical container constructed in accordance with an embodiment of the present invention.

FIG. 4b is a schematic side view of the embodiment shown in FIG. 4a.

FIG. 5b is a schematic exploded side view of the embodiment shown in FIG. 5a.

FIG. 6 is a schematic, cross-sectional side view of a bubbler with parallel gas conductance paths in the form of porous inlet tube constructed in accordance with another embodiment.

FIG. 7 is a schematic, cross-sectional side view of a bubbler with a capillary inlet conduit parallel to the main inlet conduit, creating parallel gas conductance paths in accordance with another embodiment.

FIG. 8a is a schematic, cross-sectional side view of a bubbler with flexible collapsing tube in accordance with another embodiment.

FIGS. 8b and 8c are schematic side views showing details of the flexible collapsing tube of FIG. 8a.

FIG. 11 is a schematic, cross-sectional side view of a liquid source having a semi-permeable flow conduit in accordance with another embodiment.

FIG. 12a is a schematic, cross-sectional side view of a liquid source having a double bottom in accordance with another embodiment.

FIG. 12b is a schematic cross-sectional plan view of the liquid source of FIG. 12a, showing a flow labyrinth within the lower bottom section.

DETAILED DESCRIPTION OF THE PREFERRED EMBODIMENTS

Figure 1:
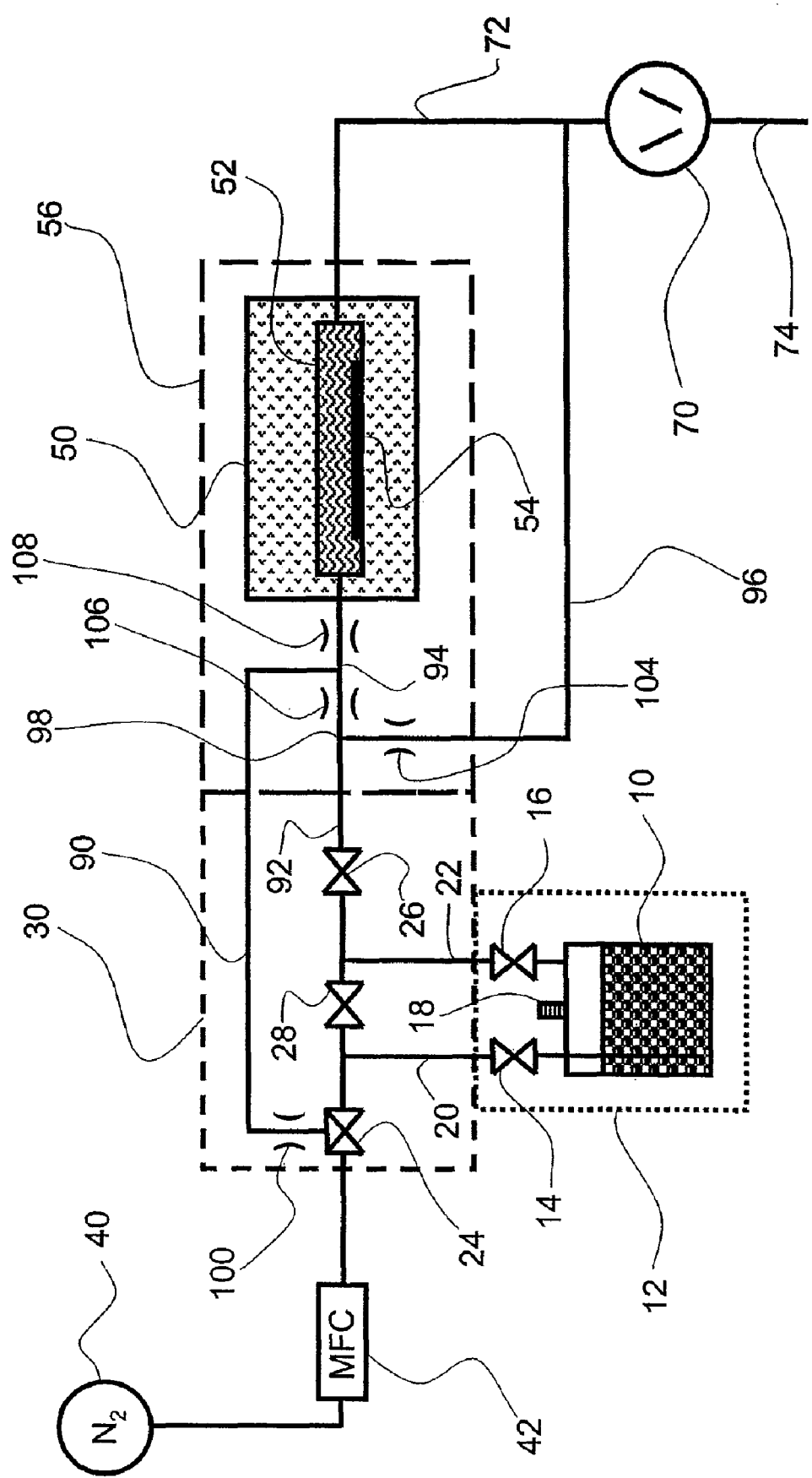
FIG. 1 is a schematic drawing of a prior art ALD system showing one liquid source coupled to the reactor.
Figure 2B:
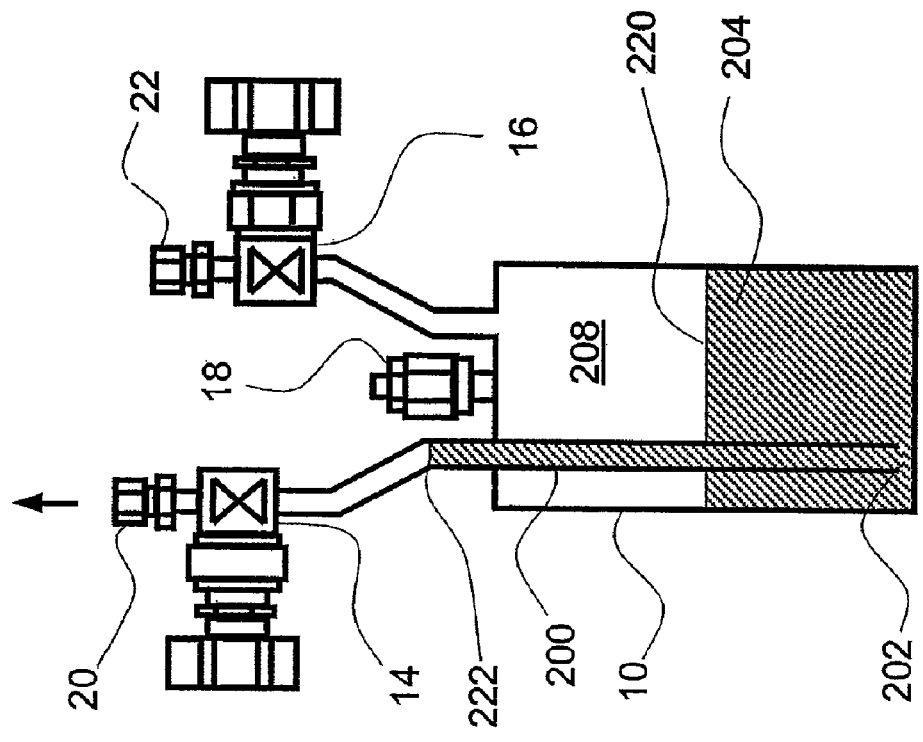
FIGS. 2a and 2b are schematic side views of a prior art bubbler-type liquid source.
Figure 2A:
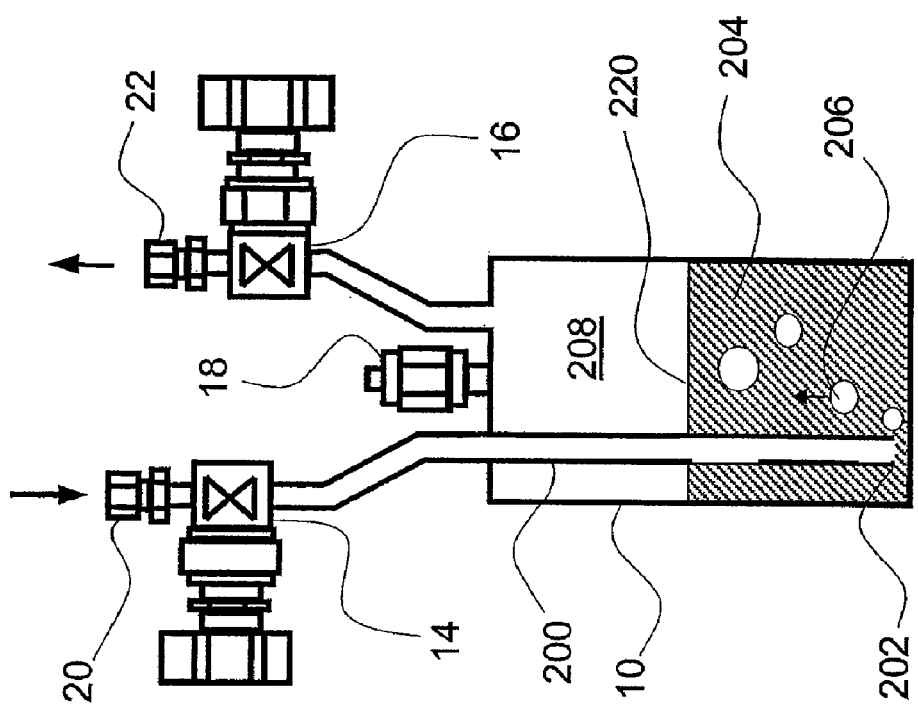
Figure 3B:
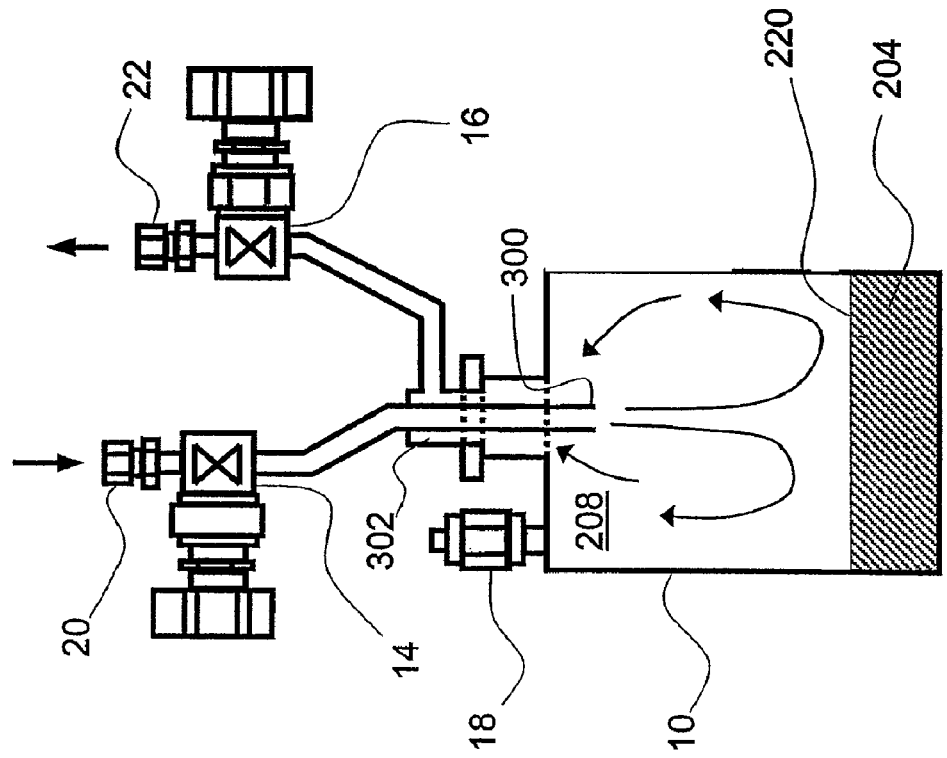
FIGS. 3a and 3b are schematic side views of a prior art overflow-type liquid source.
Figure 3A:
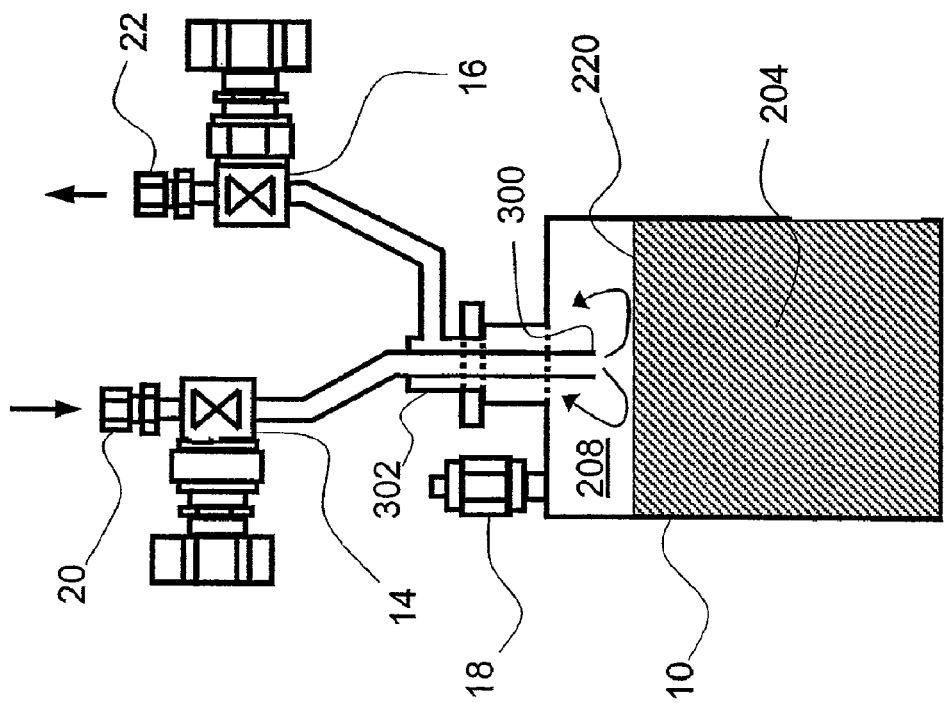

A number of embodiments are provided for a liquid source chemical apparatus that provides a vapor form of the source while minimizing the risk of liquid travelling backwardly through a carrier gas inlet tube. Certain of the embodiments provide such safety in the form of modifications to conventional "overflow" type of liquid sources, wherein the carrier gas tube is not submerged in the liquid, whereas other embodiments provide bubblers with modifications to inhibit liquid backflow through the carrier gas tube. Still other embodiments provide a novel structure employing semi-porous membranes for the carrier gas such that no route is provided for liquid flow out of the container during normal operation, and rather only vapor passes through the semi-porous membrane. Several of the embodiments employ porous elements at the interface between gas and vapor phases, advantageously enabling increasing the surface area of the interface either by way of the surfaces defined by the increased surface of the pores or by enabling a lengthened gas flow path behind the porous element.

The liquid source chemical apparatus can be employed for providing vapor phase reactant to any suitable chemical reaction. The sources described herein have particular utility for use with a vapor deposition reactor, such as chemical vapor deposition (CVD) or atomic layer deposition (ALD) reactors. As described in the Background section above, ALD is especially susceptible to pressure fluctuations that risk sending liquid reactant up a bubbler tube. Accordingly, in one embodiment, a liquid source chemical container is connected to an ALD chamber.

As is known in the art, atomic layer deposition employs alternating surface reactions whereby the apparatus, and particularly the substrate on which deposition is to be conducted, is maintained at a temperature above the condensation temperature for the vapor phase reactants and below the thermal decomposition temperatures. Sequential reactant pulses are separated in time and space to avoid gas phase reaction, since the reactants used for ALD are typically highly mutually reactive. For example, after a first reactant pulse, excess reactant and any by-product can be removed from the chamber prior to the next reactant, such as by purging with an inert gas. In a first pulse, reactant adsorbs, largely intact, on the substrate of interest in a self-limiting, self-saturating process, leaving no more than about one monolayer of reactant. In a typical arrangement, the reactant includes termination ligands that are not reactive with the gas phase of the same reactant pulse. After removal of excess reactant, the next reactant will react with the terminations, either stripping the ligands or replacing the ligands with another element or molecule of interest for the deposited layer. Excess of the second reactant is removed and either a third reactant can be introduced and removed, etc. or the cycle can start again with the first reactant. Accordingly, no more than a molecular monolayer of the desired material is formed per cycle. In fact, typically less than a monolayer will form, due to steric hindrance by bulky source chemicals blocking possible reactive sites on the surface or due to limited number of reactive sites on the surface. Variations on ALD, however, can arrive at more than a monolayer per cycle, while still deriving some of the benefit of self-limiting behavior.

As will be understood by the skilled artisan, the containers described herein are typically provided with heaters to maintain a high vapor pressure within the container. Additionally, a vacuum is applied to the container to improve the vaporization rate. Typical pressures inside the container during operation are in the range of 5 mbar to 400 mbar, more preferably between about 10 mbar and 200 mbar. The pressure inside the container is higher than the pressure of the reaction chamber during a deposition process.

With reference to FIG. 4a, according to one embodiment, an evaporator made of porous material is placed inside a liquid source container 10. The container 10 is also referred to herein as an outer container, because some of the embodiments described hereinbelow include an inner container or compartment. As noted, low pressures and high temperatures are typically employed to improve the vapor pressure of the source chemical, to provide vapor phase reactant to a downstream reactor. Accordingly, the outer container 10 is typically formed of a high structural strength metal, such as stainless steel. Additionally, the material serves as a good conductor of heat energy, and can be externally heated, e.g., by radiant heat. In other arrangements, the liquid source container can include an internal heater, such as resistive heaters.

FIG. 4a shows a top view of a gas flow divider formed by a microporous wall 400 shaped like a spiral. Preferably, the porosity of the wall 400 is in the range of 20%-80%, and more preferably 30% to 70%. In addition, or alternatively, the material of the wall 400 can be selected to be absorbent (possessing high surface energy) to facilitate capillary action to cause the liquid to ride up the wall 400. In the illustrated embodiment, the spiral wall 400 extends a height 406 of the container 10, from the bottom to the ceiling of the container 10. Inactive gas is fed approximately to a middle inlet point 402 of the container 10, proximate the container's ceiling. The gas flows towards an outlet point 404 also near the container ceiling, although the positions of inlet and outlet can be reversed. As shown in FIG. 4b, manual valves 14, 16 are used for isolating the contents of the source container 10 from the surroundings during the replacement of the container 10 with a freshly charged container.

The wall 400 serves as a gas flow divider to lengthen the flow path of the carrier gas so that there is sufficient time to saturate the inactive gas with the source chemical molecules. The flow divider lengthens the carrier gas flow path in contact with the liquid source by greater than 3 times, and more preferably greater than 5 times the length of a conventional "overflow" type of liquid source container. The skilled artisan will readily appreciate that the conventional "overflow" liquid source provides only the distance from an inlet on the ceiling to an outlet on the ceiling, both in communication with a common gas space, for the gas to travel, with some possible diffusion to deviate therefrom. Despite the porosity of the microporous wall 400, the carrier gas naturally follows the path of least resistance such that the bulk of the inactive gas flows along the illustrated spiral flow path, gradually becomes saturated with source chemical vapor, and exits the container 10 at the outlet point 404 near the ceiling. The evaporation rate of the liquid is enhanced with the microporous and/or absorbency of the material of the wall 400 that acts as an evaporator. The microporous wall 400 above the liquid is wetted by the capillary forces that pull liquid upwardly through the open pore structure of the evaporator.

The height of capillary rise can be calculated with an equation $h = 2\tau \cos \alpha / R\rho g$, wherein h is the maximum height to which the liquid surface rises, $\tau$ is the surface tension of the liquid, $\alpha$ is the contact angle between the liquid surface and the pore (or the capillary) wall, R is the radius of the pore, $\rho$ is the density of the liquid and g is the gravitational acceleration. Pore surfaces with low surface energy repel liquids so pore surfaces with high surface energy are favored when high capillary rise is desired. Materials with metal oxide surfaces, such as $SiO_2$ or $TiO_2$, have high surface energy, while materials with carbon-containing molecular groups on the surfaces, such as —$CH_3$ or —$CF_3$, have low surface energy. Thus, porous quartz ($SiO_2$) attracts liquids and porous teflon (polymerized fluorinated hydrocarbon, e.g. Gore-Tex®) repels liquids. Making the pores smaller also increases the capillary rise. In case of water, the height of capillary rise is about 150 mm when the pore radius is 100 μm and the porous material mostly consists of $SiO_2$. Decreasing the pore radius to 30 μm increases the height of capillary rise to about 500 mm. Thus, a nominal pore radius of 10 μm-200 μm is preferred to maximize effective liquid surface area exposed to the carrier gas flow, more preferably 30 μm-70 μm.

The evaporator inside the liquid container 10 can be constructed like a heat radiator. Part of it is always wetted with the liquid source chemical. There can be additional lamellas that will further enhance the evaporation of the precursor material. The gas flow is forced between these lamellas. This will increase the evaporation surface, and more significantly the time of exposure of any given packet of carrier gas to the liquid surface. The efficiency of the liquid source is improved because of the improved evaporation rate and the concentration of the source chemical vapor in the inactive gas will be relatively constant over time.

Figure 5B:
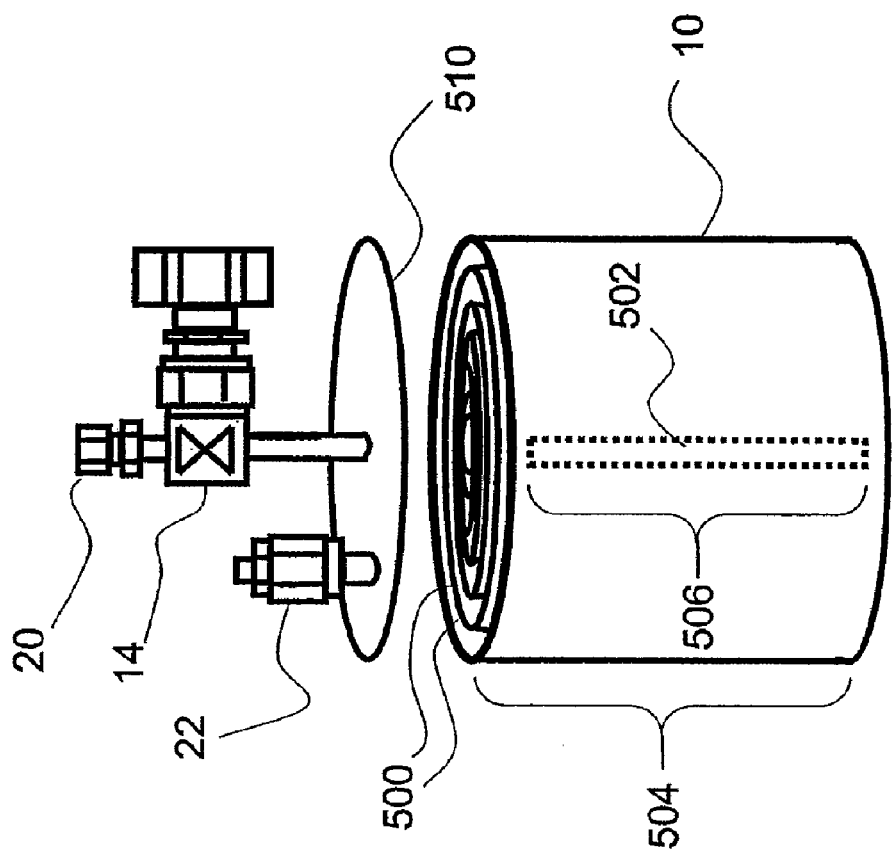
Figure 5A:
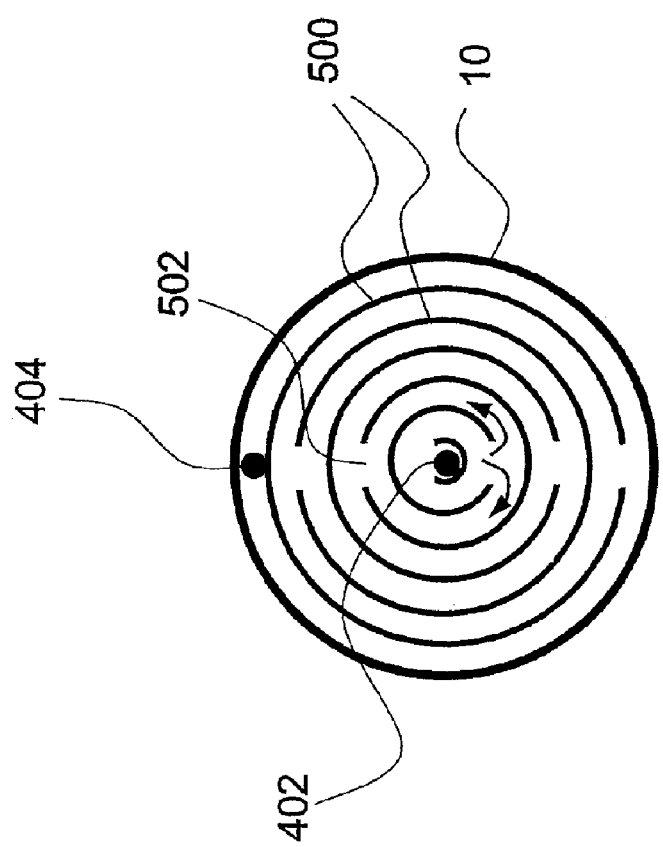
FIG. 5a is a schematic, cross-sectional plan view of another embodiment of the present invention.

According to another embodiment modified from that of FIGS. 4a and 4b and shown in FIGS. 5a and 5b, the evaporator includes a plurality of concentric microporous cylinders 500 that extend along container height 504 from the bottom to the ceiling 510 of the container 10. The cylinders 500 are preferably formed of a material having a porosity between about 20% and 80%, more preferably between about 30% and 70%. The material can alternatively, or additionally, exhibit absorbency (possessing high surface energy) to facilitate capillary action by the liquid. The cylinders 500 each have about 5-20 mm wide slits 502 that extend a slit height 506 from near the bottom edge of the cylinders to near the top edge of the cylinders 500. As shown, the slits 502 of adjacent cylinders 500 are arranged on opposite sides in staggered fashion, such that gas must flow around the annular pathways defined between cylinders 500 to reach successive slits 502. Thus, the plurality of concentric cylinders 500 define a tortuous path from the gas inlet 402, opening above the liquid surface, to the gas outlet 404, also above the liquid surface. Preferably the path length is characterized by a ratio between the path length and the total liquid surface area (length:area) between about 1:1000 $cm^{-1}$ and 2:10 $cm^{-1}$, more preferably between about 2:100 $cm^{-1}$ and 1:10 $cm^{-1}$.

In operation, capillary forces lift liquid source chemical up the microporous and/or absorbent cylinder walls. Inactive gas is fed approximately to the middle point 402 of the container ceiling 510. The gas flows a tortuous path between the cylinder 500 walls and through the slits 502 and gradually becomes saturated with vapor phase source chemical molecules as it traverses the tortuous path. Finally the gas mixture exits the container 10 at the outlet point 404 near the outer edge of the container ceiling 510. The source is safe to operate because the tip of the inlet conduit is arranged to be always above the liquid surface. The evaporator structure enhances the evaporation of the liquid and the concentration of the source chemical stays constant in the gas mixture at the outlet 22 during the depositions.

Figure 6:
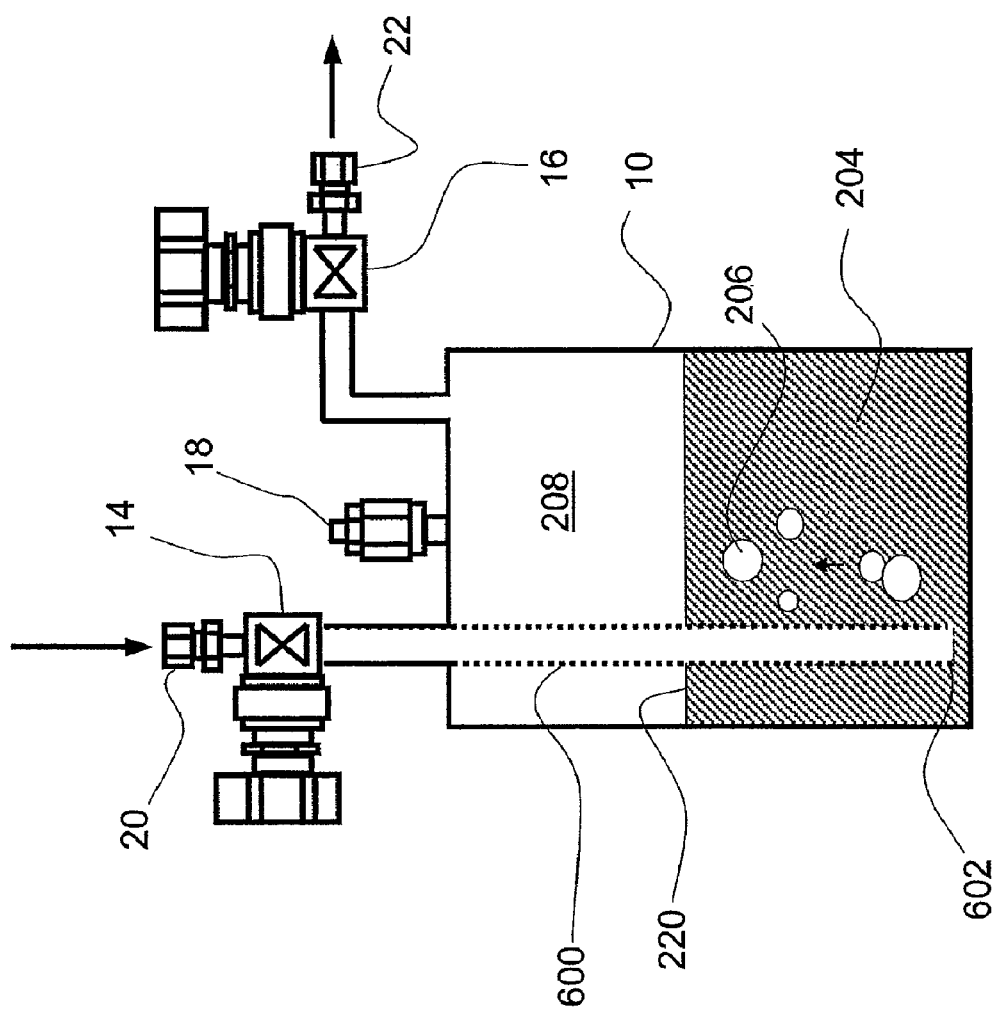

According to still another embodiment shown in FIG. 6, a by-pass conductance is arranged for releasing the pressure difference between a feeding tube inlet 20 and a gas space 208 inside the source container. The feeding tube 600 extending from the inlet 20 into the container 10 is preferably made from a porous material. The pores (or other openings) are made more restrictive than the main opening 602 at the bottom of the feeding tube 600, including accounting for the pressure of a "full" or freshly refilled liquid. Preferably, the porosity is between about 30% and 70%, more preferably between about 40% and 60%, or the gas flow conductance through the feeding tube wall is about ⅟₂₀-⅕ of the gas flow conductance along the feeding tube, and can include macro perforations. Accordingly, in operation the main part of the inactive gas flow goes along the feeding tube 600 to the bottom opening and a minor part of the inactive gas flow goes through the porous wall of the feeding tube 600. Preferably greater than about 50% of the gas flow exits at the bottom opening 602, more preferably greater than about 95%. Thus, the container operates essentially in bubbler mode during each source chemical pulse.

When the pressure at the inlet 20 becomes lower than the pressure of the gas space 208 of the container 10 above the liquid 204, gas flows backwardly through the walls of the porous feeding tube 600 into the upper part of the feeding tube. Liquid 204 stays in the container 10 because the hydrostatic pressure of the liquid column inside the feeding tube will be about equal to the pressure difference across the walls of the porous feeding tube wall 600. The gas flowing through the porous walls of the feeding tube 600 releases any overpressure before the pressure difference is big enough to push the precursor liquid backwards to the inlet 20. Thus, the pores of the feeding tube 600 serve as a by-pass conductance for releasing any overpressure in the gas space 208.

According to Boyle's Law (pV=nRT) the quantity of the gas that must be released depends on the pressure and volume when the temperature is constant. This means that the releasing flow should be higher when the bottle is almost empty compared to the situation where the bottle is full. The effect is linear. The conductance of the porous tube is a linear function of the length of the tube. Since the risk of backflow increases as the gas volume 208 increases, the growing capacity for backflow release through the lengthening bare section of the porous tube compensates for this increasing risk as the liquid 204 is consumed. The liquid 204 is a liquid source chemical that is selected for example from alkylaluminum compounds such as trimethyl aluminum $(CH_3)_3Al$, also known as TMA, metal halides such as titanium tetrachloride $TiCl_4$, boron compounds such as triethyl boron $(CH_3CH_2)_3B$, also known as TEB, silicon compounds such as trisilane $Si_3H_8$, alcohols such as ethanol, and water $H_2O$.

Figure 7:
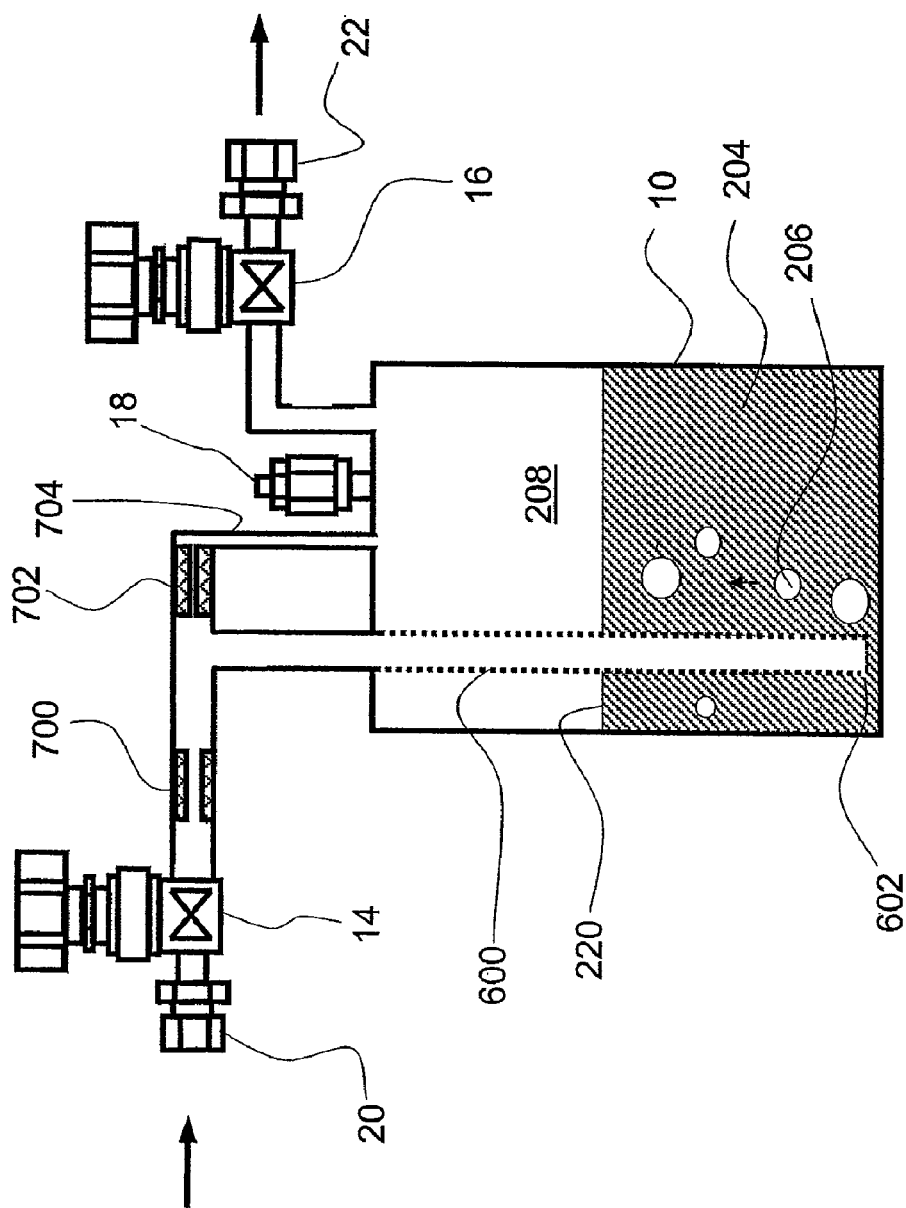

Referring now to FIG. 7, according to still another embodiment a parallel capillary line is arranged to prevent the backflow of liquid. FIG. 7 shows a schematic side view of a bubbler source container 10 having a by-pass line 704. The by-pass line 704 communicates with the internal gas space 208 and equalizes the gas pressure between the restrictions or capillaries 700, 702 and the gas space 208 of the container 10. The capillary 702 has high enough conductance to prevent the back flow of the liquid along the bubbler tube 600. On the other hand, the capillary has low enough flow conductivity so that during a source pulse most of the inactive gas will flow from the inlet 20 along the bubbler tube 600 to the liquid 204, rather than directly to the gas space 208. Preferably, during normal operation, greater than about 90% of the inert carrier gas flows through the feeding tube 600 and less than about 10% through the by-pass tube 704, more preferably less than about 5%. The bubbler tube 600 can be, for example, a metal tube, a perforated metal tube or a porous tube as described with respect to FIG. 6. Flow conductivity through the wall of the bubbler tube 600 is added to the flow conductivity of the capillary 702 to determine how much carrier gas flows directly to the gas space 208. Accounting for the gas flow escaping through the by-pass line 704 and through the pores of the bubbler tube 600 directly into the gas space 208, preferably greater than about 80% of the total inert carrier gas flow exits the main opening 602 submerged in the water, more preferably greater than about 90%. When the flow conductivity of the capillary 702 is increased the flow conductivity through the wall of the bubbler tube 600 can be decreased.

A liquid column rising inside the bubbler tube 600 creates a hydrostatic pressure that pulls the liquid column downwardly. A general formula for the hydrostatic pressure is presented in Eq. 1, $$p = g\rho h \qquad \text{Eq. 1}$$

wherein p is hydrostatic pressure of the liquid, g is gravitational acceleration, $\rho$ is the density of the liquid and h is the height of the liquid column measured from the liquid surface 220. Any pressure difference between the capillary space (between capillaries 700, 702) and the gas space 208 of the container 10 lifts liquid up along the bubbler tube 600 until the pressure difference is equal to the hydrostatic pressure of the liquid column. Because the pressure difference is eliminated by gas flow through the capillary 702, the liquid column will also be eliminated and the liquid surface level inside the bubbler tube 600 will be about the same as the liquid surface level 220 within the container 10.

According to another embodiment shown in FIGS. 8a, 8b and 8c, the porous bubbler tube 600 is complemented with a very elastic inner tube 800. The bubbler tube 600, which can be made, e.g. of metal, polymer or ceramic material, supports the elastic tube 800. If a pressure differential urges the liquid to flow backwardly to the bubbler tube 600, the elastic tube 800 collapses temporarily because of fluid flow 802 through the porous or perforated wall of the bubbler tube, and the backflow stops. The elastic tube stays collapsed as long as there is higher pressure in the liquid 204 than at the upper end of the bubbler tube 600. Preferably, the elastic tube 800 has a Shore hardness according to DIN 53505 A between about 30° and 70°, more preferably between about 35° and 45°.

Figures 9A, 9B:
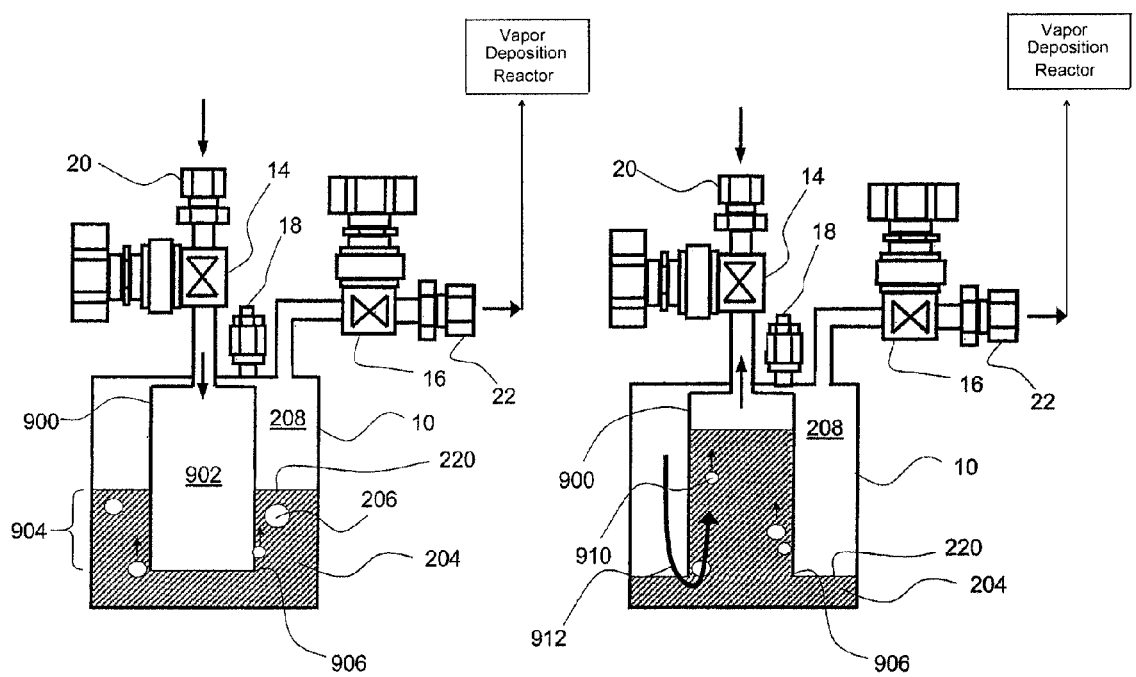
FIG. 9a is a schematic, cross-sectional side view of a liquid source with an inner inlet container in accordance with another embodiment.
FIG. 9b is a schematic side view of the liquid source of FIG. 9a under the influence of a high internal gas pressure.

Referring now to FIGS. 9a and 9b, according to still another embodiment, the feeding tube is enlarged relative to a conventional bubbler tube. This enlarged bubbler or inlet tube is referred to for the illustrated embodiment as an inlet container 900, defining an inner space 902 with a volume $V_I$. The bottom of the inlet container 900 is open. The source container 10 volume $V_S$ and the liquid fill level 220 of the container 10 are selected so that the volume $V_L$ 904 (representing the amount of the liquid 204 between the "full" liquid surface level 220 and a bottom edge 906 of the inlet container 900), is smaller than the volume $V_I$ of the entire inlet container 900.

While the depth of the tank below the bottom edge 906 of the inlet container 900 is irrelevant to this function, typically the inlet container 900 should reach near the bottom of the container 10 in order to function as a bubbler until the liquid 204 is nearly exhausted, for the sake of efficiency. Accordingly, the volume 902 of the inlet container 900 preferably represents greater than about 15% of the volume $V_S$ of the source container 10 (including both the liquid volume 204 and the gas volume 208), and more preferably the volume $V_I$ is greater than about 40% of the container volume $V_S$. Without regard to the overall height or depth of the container 10, the inlet container 900 is preferably designed to have a horizontal cross-sectional surface area representing greater than about 40% the horizontal cross-sectional surface area of the source container 10 (also referred to as an outer container), more preferably greater than about 50%.

In operation, possible back flow of liquid is stored into the volume $V_I$ of the inner space 902, as shown in FIG. 9b. Flow of the liquid to the inlet container 900 stops when the liquid surface level 220 reaches the bottom edge 906 of the inlet container 900. After that only gas can bubble 910 through the inlet container 900. Accordingly, the bottom edge 906 of the inlet container 900 provides a by-pass conductance path 912 for gas to bypass the remaining liquid below the inner container 900, thus releasing any pressure difference between the feeding tube inlet 20 and the gas space 208 within the container 10. Disastrous flow of the liquid source chemical upstream of the inlet container 900 to the inactive gas feeding system is prevented.

Figure 10B:
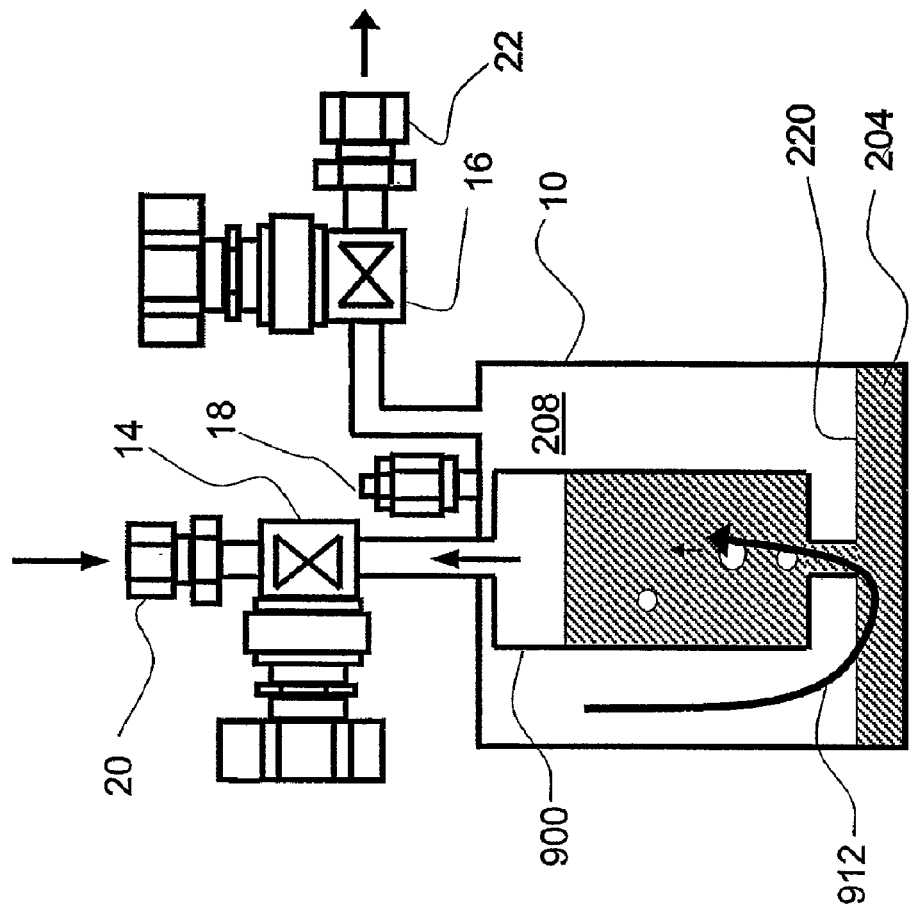
FIGS. 10a and 10b are schematic side views of an embodiment modified from the embodiment in FIGS. 9a and 9b.
Figure 10A:
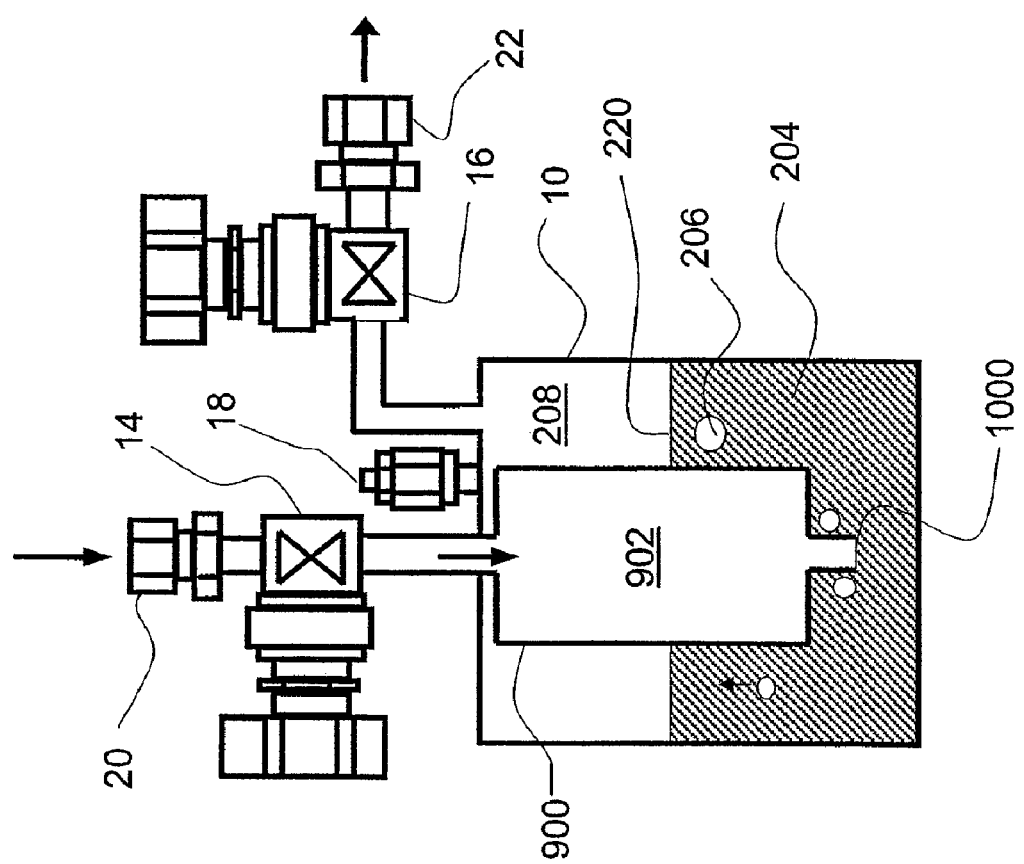

Modification of the embodiment presented in FIGS. 9a and 9b results in an inlet container design that has certain benefits. FIGS. 10a and 10b show an inlet container 900 that has a reduced or restricted opening 1000 against the liquid phase 204. The overall volume of the inner space 902 of the inner container 900 is preferably as described above with respect to FIGS. 9a and 9b. The restricted opening 1000, however, preferably represents less than 10% of the total horizontal cross-sectional surface area of the inner container 900, more preferably less than about 5%. Inactive gas has a high flow speed through the relatively small opening 1000 and the bubbles 206 will be smaller than in case of a larger opening. A coarse sinter can also be placed at the opening 1000 to even further decrease the size of bubbles. Small inactive gas bubbles saturate with source chemical molecules faster than large bubbles, because small bubbles have a higher surface area:volume ratio than large bubbles.

Figure 11:
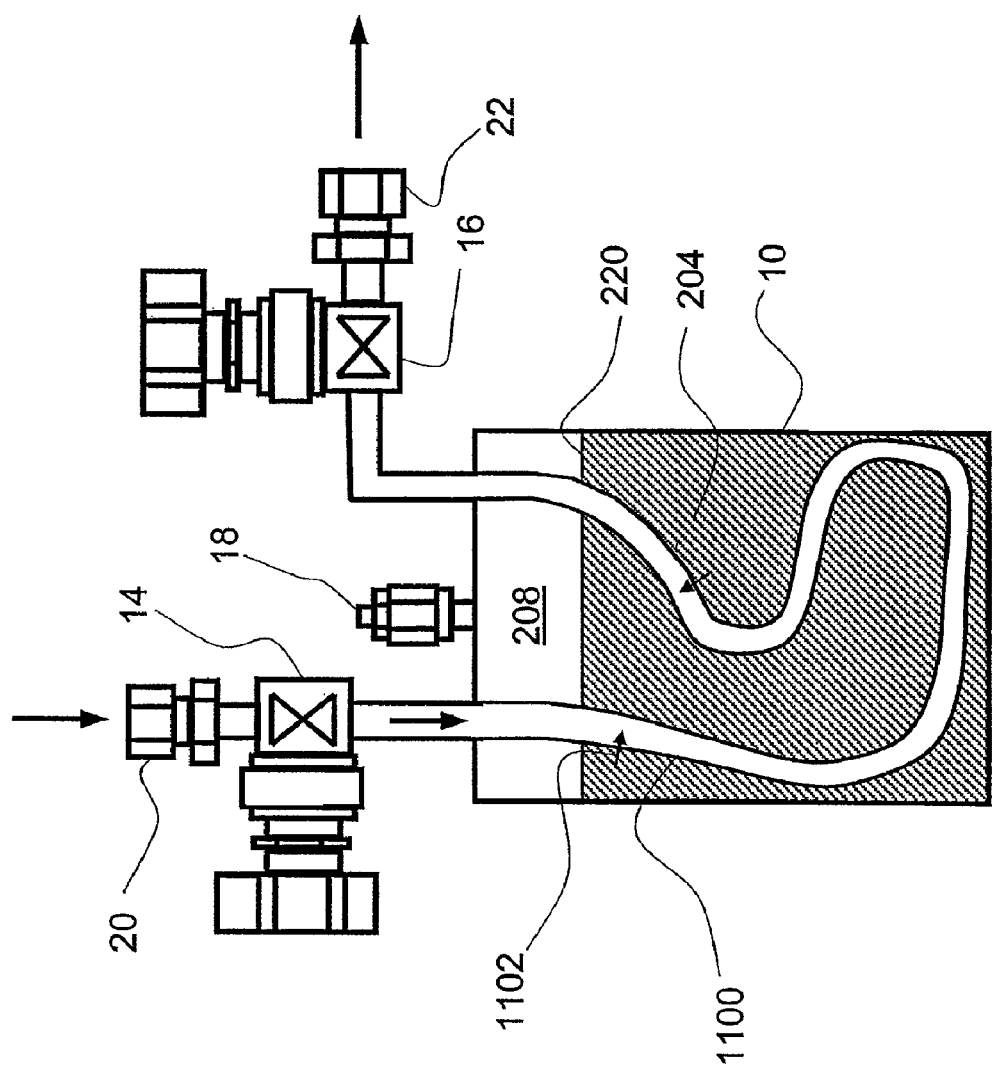

According to still another embodiment shown in FIG. 11, the liquid source is constructed so that the inactive carrier gas flows along a semi-permeable tube 1100 that is at least partly submerged under the liquid surface level 220. The semi-permeable membrane of the tube 1100 serves as a flow divider for guiding gas flow and as the evaporating surface, since only vapor form of the source chemical passes from the liquid phase 204 into the tube 1100, as indicated by the arrows 1102. Desirably, the tube 1100 is elongated and follows a relatively long path through the liquid 204 to increase the overall surface area available for evaporation. Source chemical molecules that have diffused through the tube 1100 become mixed with the inactive gas so that a saturated mixture is obtained inside the tube 1100 in the source container 10 by the time the gas mixture reaches the outlet. Thus, no route exists for liquid source chemical 204 to escape the container 10 during normal operation.

The semi-permeable tube 1100 is made, for example, of a Gore-Tex® membrane supported with a perforated polymer tube. A Gore-Tex® membrane comprises a polytetrafluoroethylene (PTFE)-based expanded fabric that has billions of pores per square inch. The pores are too small (10-30 μm) for liquid droplets to pass through, so liquid stays on the outside. On the other hand the pores are large enough to allow molecules in the vapor formed from the liquid to pass through the membrane by diffusion, making the membrane "breathable". The membrane has low surface energy so that the liquid 204 does not wet the membrane. The surface tension of the liquid keeps the liquid outside the tube 1100. Gore-Tex® is commercially available from the W.L. Gore Corp., Newark, Del. Preferably the porosity of the semi-permeable membrane of the tube 1100 is between about 70% and 93%, more preferably between about 80% and 85%. According to still another embodiment the semi-permeable tube 1100 is made of a hydrophilic non-porous polymer such as hydrophilic polyester block copolymer commercially sold under trademark Sympatex®. Molecules having polar functional groups such as water and amines travel from the liquid phase through the hydrophilic zones in the Sympatex® membrane and enter the gas phase. Liquid droplets cannot flow through the non-porous membrane.

With reference now to FIGS. 12a and 12b, the evaporating surface can be constructed as an interface between the liquid phase 204 and an inner compartment 1200. The inner compartment 1200 is at least partially submerged within the liquid 204 and comprises a perforated wall 1208 with an adjacent semi-permeable membrane 1210 (e.g., Gore-Tex®) supported either on the inner container side or on the liquid side of the perforated wall 1208. In the illustrated embodiment, the perforated wall 1208 and the semi-permeable membrane 1210 serve to create a double bottom for the container 10. In addition to providing the evaporating surface, the membrane 1210 also serves as a flow divider, partially defining a gas flow path.

In other arrangements, the inner compartment 1200 can be formed on a side wall, such as in the form of an annular space between the outer wall of the container 10 and a perforated inner cylindrical or other shaped container defined by a perforated wall 1208 and attached membrane 1210. In still another arrangement, a container is completely surrounded by and submerged within the liquid 204, in which case multiple or all walls of the inner compartment can be formed by perforated walls and attached membranes. In this example, a particularly large surface area provides the evaporating surface for liquid to vaporize through the membrane into the inner compartment 1200.

Preferably, the inner compartment 1200 defines a tortuous gas flow path from the container's gas inlet to outlet, interfacing with the liquid 204 only by way of the membrane(s). As shown in FIG. 12b, a gas flow labyrinth within the inner compartment 1200 can be machined, for example, from a block of metal. Circular gas flow channels are separated from each other by additional flow dividers in the form of walls 1220 that extend a height 1206 from the bottom to the wall 1208 of the inner compartment 1200. Openings 1222 are machined into the walls 1220, preferably on alternated sides, so that gases flow along a tortuous path from one circular channel to the next one until the exit point 1204 of the inner compartment 1200 is reached. Inactive gas is fed to the inlet point 1202 of the inner compartment 1200 and the gas gradually becomes saturated with the source chemical molecules that have diffused from the liquid phase 204 through the membrane 1210 on the perforated wall 1208 to the gas flow paths defined within the labyrinth. It will be understood that the labyrinth within the inner compartment 1200 can take other more or less complicated forms, such as the spiral flow divider of FIG. 4a. The membrane 1210 acts as an evaporator surface that does not let any liquid droplets through. One benefit of the construction is that the gas flow channels stay dry during the deposition processes.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A liquid source chemical vaporizer for vaporizing liquid source chemical and delivering vapor phase chemical to a vapor deposition reactor, the source chemical vaporizer comprising:
    an outer container configured to hold liquid source chemical, the outer container at least partially defining a source container volume;
    a carrier gas inlet in communication with the source container volume;
    a gas mixture outlet in communication with the vapor deposition reactor and the source container volume; and
    an inlet container at least partially defining an inner space volume, the inlet container comprising a bottom edge and having an opening proximate to a bottom of the outer container, the inner space volume being greater than about 15% of the source container volume.

2. The source chemical vaporizer of claim 1, wherein the inner space volume is greater than about 40% of the source container volume.

3. The source chemical vaporizer of claim 1, wherein the outer container and a fill level of the liquid source chemical at least partially define an inner gas volume within the outer container, wherein the carrier gas inlet is in communication with the inner gas volume, and wherein the gas mixture outlet is in communication with the inner gas volume.

4. The source chemical vaporizer of claim 1, wherein the outer container has a horizontal cross-sectional area and the inlet container has a horizontal cross-sectional area, wherein the horizontal cross-sectional area of the inlet container is greater than about 40% of the horizontal cross-sectional area of the outer container.

5. The source chemical vaporizer of claim 1, wherein the outer container has a horizontal cross-sectional area and the inlet container has a horizontal cross-sectional area, wherein the horizontal cross-sectional area of the inlet container is greater than about 50% of the horizontal cross-sectional area of the outer container.

6. The source chemical vaporizer of claim 1, wherein the inlet container has a horizontal cross-sectional area and the opening of the bottom edge of the inlet container has a horizontal cross-sectional area, wherein the horizontal cross-sectional area of the opening of the bottom edge of the inlet container is smaller than the horizontal cross-sectional area of the inlet container.

7. The source chemical vaporizer of claim 6, wherein the horizontal cross-sectional area of the opening of the bottom edge of the inlet container is less than about 10% of the horizontal cross-sectional area of the inlet container.

8. The source chemical vaporizer of claim 6, wherein the horizontal cross-sectional area of the opening of the bottom edge of the inlet container is less than about 5% of the horizontal cross-sectional area of the inlet container.

9. The source chemical vaporizer of claim 1, further comprising a coarse sinter at the opening of the bottom edge of the inlet container.

10. A liquid source chemical vaporizer comprising:
a tank having a tank volume and holding a volume of liquid source chemical at a liquid fill level, the tank at least partially defining an inner gas volume above the liquid fill level;
a gas outlet in communication with a vapor deposition reactor and the inner gas volume of the tank; and
a bubbler tube at least partially defining a gas flow path from a gas inlet to the gas outlet, the bubbler tube having a lower edge below the liquid fill level, the bubbler tube at least partially defining a bubbler tube volume, the volume of the liquid source chemical above the lower edge of the bubbler tube being smaller than the bubbler tube volume.

11. The source chemical vaporizer of claim 10, wherein the bubbler tube volume is greater than about 15% of the tank volume.

12. The source chemical vaporizer of claim 10, wherein the bubbler tube volume is greater than about 40% of the tank volume.

13. The source chemical vaporizer of claim 10, wherein the tank has a horizontal cross-sectional area and wherein the bubbler tube has a horizontal cross-sectional area, wherein the horizontal cross-sectional area of the bubbler tube is greater than about 40% of the horizontal cross-sectional area of the tank.

14. The source chemical vaporizer of claim 10, wherein the tank has a horizontal cross-sectional area and wherein the bubbler tube has a horizontal cross-sectional area, wherein the horizontal cross-sectional area of the bubbler tube is greater than about 50% of the horizontal cross-sectional area of the tank.

15. The source chemical vaporizer of claim 10, wherein the tank has a horizontal cross-sectional area and wherein the lower edge of the bubbler tube includes an opening having a horizontal cross-sectional area smaller than the horizontal cross-sectional area of the bubbler tube.

16. The source chemical vaporizer of claim 15, wherein the horizontal cross-sectional area of the opening is less than about 10% of the horizontal cross-sectional area of the bubbler tube.

17. The source chemical vaporizer of claim 15, wherein the horizontal cross-sectional area of the opening is less than about 5% of the horizontal cross-sectional area of the bubbler tube.

18. The source chemical vaporizer of claim 10, wherein the lower edge of the bubbler tube includes a coarse sinter.

19. A liquid source bubbler system comprising:
a container configured to hold liquid source chemical;
a bubbler tube in communication with a gas source, the bubbler tube extending into an opening within a liquid storage space;
a gas outlet in communication with a vapor deposition reactor and an inner gas space defined within the container above the liquid storage space; and
a by-pass conductance route configured to release excess gas pressure from within the inner gas space to the gas inlet, thereby inhibiting liquid flow up the bubbler tube.

20. The system of claim 19, wherein the by-pass conductance path comprises a plurality of openings in a wall of the bubbler tube, at least some of the openings opening from the bubbler tube to the inner gas space.

21. The system of claim 19, wherein the bubbler tube comprises a gas flow divider configured to allow vapor phase reactant to pass through while preventing, liquid phase reactant from passing through and wherein the gas flow divider comprises the by-pass conductance route.

* * * * *